United States Patent
Hsu et al.

(10) Patent No.: US 9,560,788 B2
(45) Date of Patent: Jan. 31, 2017

(54) HEAT DISSIPATION DEVICE AND CONTROL METHOD THEREOF

(71) Applicant: Wistron Corporation, New Taipei (TW)

(72) Inventors: Chia-Lung Hsu, New Taipei (TW); Po-Cheng Chen, New Taipei (TW); Ming-Chih Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 419 days.

(21) Appl. No.: 14/151,820

(22) Filed: Jan. 10, 2014

(65) Prior Publication Data

US 2015/0173241 A1    Jun. 18, 2015

(30) Foreign Application Priority Data

Dec. 17, 2013    (TW) .............................. 102146712 A

(51) Int. Cl.
H05K 7/20    (2006.01)
G06F 1/20    (2006.01)

(52) U.S. Cl.
CPC ........... *H05K 7/20209* (2013.01); *G06F 1/203* (2013.01); *H05K 7/20172* (2013.01)

(58) Field of Classification Search
CPC  H05K 7/20209; H05K 7/20136; G06K 1/203; H01L 29/24
USPC .................................... 310/316.01, 317, 333
See application file for complete search history.

(56) References Cited

U.S. PATENT DOCUMENTS

| | | | | |
|---|---|---|---|---|
| 7,061,161 | B2* | 6/2006 | Scher | H01L 41/0993 310/328 |
| 2006/0208614 | A1* | 9/2006 | Scher | H01L 41/0993 310/311 |
| 2009/0026881 | A1* | 1/2009 | Erturk | F04D 33/00 310/311 |
| 2009/0167450 | A1* | 7/2009 | Shinogi | H02M 3/16 331/156 |
| 2011/0064594 | A1* | 3/2011 | Wada | G06F 1/20 417/410.2 |
| 2011/0245976 | A1* | 10/2011 | Thompson | G06F 1/206 700/275 |
| 2013/0258589 | A1* | 10/2013 | Yu | F04D 33/00 361/694 |

(Continued)

FOREIGN PATENT DOCUMENTS

CN    101354045    1/2009
TW    201340853    10/2013

OTHER PUBLICATIONS

"Office Action of Taiwan Counterpart Application," issued on Mar. 2, 2015, with English translation thereof, p. 1-p. 9.

(Continued)

*Primary Examiner* — Shawki S Ismail
*Assistant Examiner* — Bryan Gordon
(74) *Attorney, Agent, or Firm* — Jianq Chyun IP Office

(57) ABSTRACT

A heat dissipation device including a driving module and a heat dissipation sheet is provided. The heat dissipation sheet has a connection portion and a swing portion and is connected to the driving module by the connection portion. When the driving module receives an input voltage to drive the connection portion, the connection portion drives the swing portion to swing back and forth so as to generate a heat dissipation airflow.

13 Claims, 6 Drawing Sheets

(56) References Cited

U.S. PATENT DOCUMENTS

2013/0301218 A1 11/2013 Li et al.
2013/0309107 A1* 11/2013 Chen ................... F04B 45/047
                                                        417/410.1

OTHER PUBLICATIONS

"Office Action of China Counterpart Application" with partial English translation, issued on Sep. 21, 2016, p. 1-p. 24.

* cited by examiner

HEAT DISSIPATION DEVICE AND CONTROL METHOD THEREOF

CROSS-REFERENCE TO RELATED APPLICATION

This application claims the priority benefit of Taiwan application serial no. 102146712, filed on Dec. 17, 2013. The entirety of the above-mentioned patent application is hereby incorporated by reference herein and made a part of this specification.

BACKGROUND

Technical Field

The invention relates to a heat dissipation device and a control method thereof. Particularly, the invention relates to a heat dissipation device capable of swinging a heat dissipation sheet to generate a heat dissipation airflow and a control method thereof.

Related Art

In recent years, along with development of technology, portable electronic devices such as notebooks (NB), tablet PCs and smart phones, etc. become popular in the consumer market. Along with continuous improvement of operation performance of the portable electronic device, heating power of electronic components in the portable electronic device is also increased.

In order to prevent temporary or permanent failure of the electronic components due to overheat, or avoid overheat of a casing of the portable electronic device to cause user's discomfort, a cooling fan is generally disposed in internal of the portable electronic device to dissipate heat. The conventional cooling fan generates a heat dissipation airflow by rotating fan blades thereof. Due to the design of the fan blades, the cooling fan cannot be effectively thinned, which is not complied with a current thinning design trend of the electronic devices. Moreover, the conventional cooling fan has a greater power consumption during operation, which decreases power durability of the portable electronic device.

SUMMARY

The invention is directed to a heat dissipation device, which has a smaller thickness and less power consumption.

The invention is directed to a control method of heat dissipation device, by which the heat dissipation device consumes less power.

The invention provides a heat dissipation device including a driving module and a heat dissipation sheet. The heat dissipation sheet has a connection portion and a swing portion and is connected to the driving module through the connection portion. When the driving module receives an input voltage to drive the connection portion, the connection portion drives the swing portion to swing back and forth to generate a heat dissipation airflow.

In an embodiment of the invention, the heat dissipation device further includes a control unit, where the control unit is electrically connected to the driving module and controls a frequency and amplitude of the input voltage.

In an embodiment of the invention, the control unit controls the frequency of the input voltage to adjust a swing frequency and a swing range of the swing portion, and controls the amplitude of the input voltage to adjust the swing range of the swing portion.

In an embodiment of the invention, the heat dissipation device is adapted to an electronic device, where the electronic device has a heat source, and the control unit is adapted to control the frequency and the amplitude of the input voltage according to a temperature of the heat source.

In an embodiment of the invention, when the temperature of the heat source is lower than a first temperature, the control unit turns off the input voltage, when the temperature of the heat source is higher than the first temperature and is lower than a second temperature, the control unit controls the input voltage to have a first frequency and a first amplitude, and when the temperature of the heat source is higher than the second temperature, the control unit controls the input voltage to have a second frequency and a second amplitude, where the first frequency is equal to a natural frequency of the swing portion, the second frequency is greater than the natural frequency of the swing portion, and the second amplitude is greater than the first amplitude.

In an embodiment of the invention, when the input voltage has the first frequency and the first amplitude, the swing range of the swing portion is equal to a threshold, and when the input voltage has the second frequency and the second amplitude, the swing range of the swing portion is equal to the threshold.

In an embodiment of the invention, the control unit includes a first controller and a second controller. The first controller is adapted to generate a decision signal according to the temperature of the heat source. The second controller is electrically connected to the first controller and the driving module, where the input voltage is adapted to be provided to the driving module through the second controller, and the second controller is adapted to control the frequency and the amplitude of the input voltage according to the decision signal.

In an embodiment of the invention, the driving module includes a coil unit, a vibration element and a magnetic element. The vibration element has an elastic portion and a vibration portion, where the elastic portion is connected between the coil unit and the vibration portion, and the connection portion of the heat dissipation sheet is fixed to the vibration portion. The magnetic element is fixed to the vibration portion and is aligned to the coil unit, where when the coil unit receives the input voltage to produce a magnetic field to affect the magnetic element, the vibration portion vibrates due to elastic deformation of the elastic portion to drive the connection portion of the heat dissipation sheet.

In an embodiment of the invention, the driving module includes a piezoelectric piece. The piezoelectric piece is fixed to the connection portion, where when the piezoelectric piece receives the input voltage, the piezoelectric piece is deformed to drive the connection portion.

In an embodiment of the invention, the heat dissipation sheet is a flexible sheet.

In an embodiment of the invention, a thickness of the swing portion along a direction is smaller than thickness of the swing portion along other directions, and the connection portion is adapted to drive the swing portion to swing back and forth along the direction to generate the heat dissipation airflow.

The invention provides a control method of heat dissipation device, which is adapted to the heat dissipation device. The heat dissipation device includes a driving module and a heat dissipation sheet. The control method includes following steps. An input voltage is provided to the driving module, and the driving module drives the heat dissipation sheet to swing back and forth to generate a heat dissipation airflow. A control unit is used to control a frequency and amplitude of the input voltage.

In an embodiment of the invention, the step of controlling the frequency and the amplitude of the input voltage includes following steps. The frequency of the input voltage is controlled to adjust a swing frequency and a swing range of the heat dissipation sheet. The amplitude of the input voltage is controlled to adjust the swing range of the heat dissipation sheet.

In an embodiment of the invention, the heat dissipation device is adapted to an electronic device, where the electronic device has a heat source, and the step of controlling the frequency and the amplitude of the input voltage includes a following step. The frequency and the amplitude of the input voltage is controlled according to a temperature of the heat source.

In an embodiment of the invention, the step of controlling the frequency and the amplitude of the input voltage according to the temperature of the heat source includes following steps. When the temperature of the heat source is lower than a first temperature, the control unit is used to turn off the input voltage. When the temperature of the heat source is higher than the first temperature and is lower than a second temperature, the control unit is used to control the input voltage to have a first frequency and a first amplitude, where the first frequency is equal to a natural frequency of the swing portion. When the temperature of the heat source is higher than the second temperature, the control unit is used to control the input voltage to have a second frequency and a second amplitude, where the second frequency is greater than the natural frequency of the swing portion, and the second amplitude is greater than the first amplitude.

In an embodiment of the invention, the step of controlling the input voltage to have the first frequency and the first amplitude includes controlling the swing range of the swing portion to be equal to a threshold, and the step of controlling the input voltage to have the second frequency and the second amplitude includes controlling the swing range of the swing portion to be equal to the threshold.

In an embodiment of the invention, the control unit includes a first controller and a second controller. The step of controlling the frequency and the amplitude of the input voltage includes following steps. A decision signal is generated by the first controller according to the temperature of the heat source. The frequency and the amplitude of the input voltage is controlled by the second controller according to the decision signal.

In an embodiment of the invention, a thickness of the heat dissipation sheet along a direction is smaller than thickness of the heat dissipation sheet along other directions, and the step of driving the heat dissipation sheet to swing back and forth includes driving the heat dissipation sheet to swing back and forth along the direction.

According to the above descriptions, the heat dissipation device generates the heat dissipation airflow by swinging the swing portion of the heat dissipation sheet thereof rather than rotating fan blades to generate the heat dissipation airflow as that does of a conventional cooling fan. Compared to the fan blades of the conventional cooling fan, the heat dissipation sheet of the invention has a thinner thickness, which avails a thinning design of the electronic device. Moreover, Compared to the fan blades of the conventional cooling fan, a weight of the heat dissipation sheet is lighter, and it consumes less power when the driving module drives the heat dissipation sheet, such that power durability of the electronic device is enhanced.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
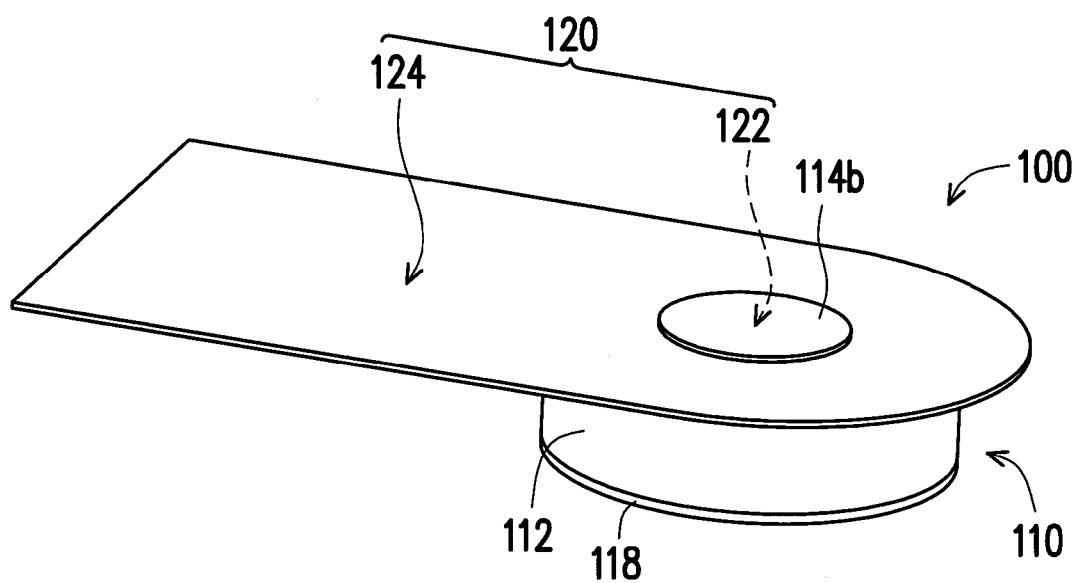
FIG. 1 is a three-dimensional view of a part of components of a heat dissipation device according to an embodiment of the invention.
Figure 2:
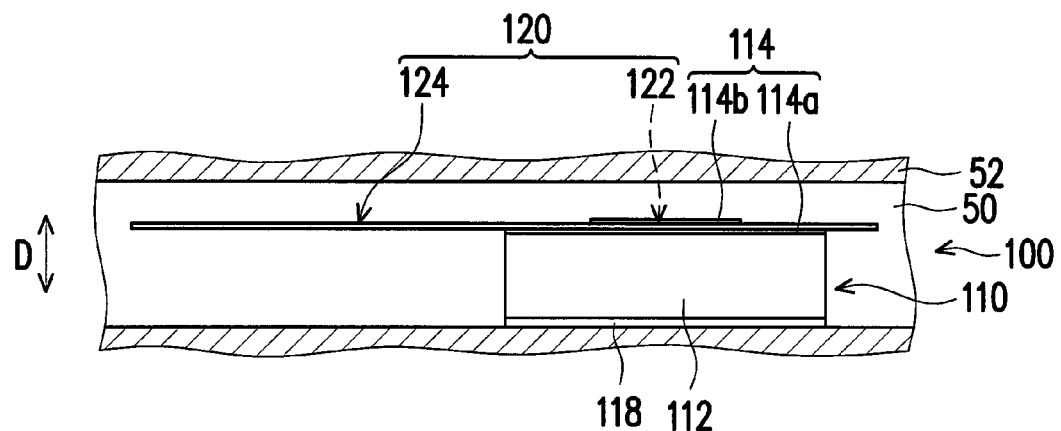
FIG. 2 is a schematic diagram of applying the heat dissipation device of FIG. 1 to an electronic device.
Figure 3:
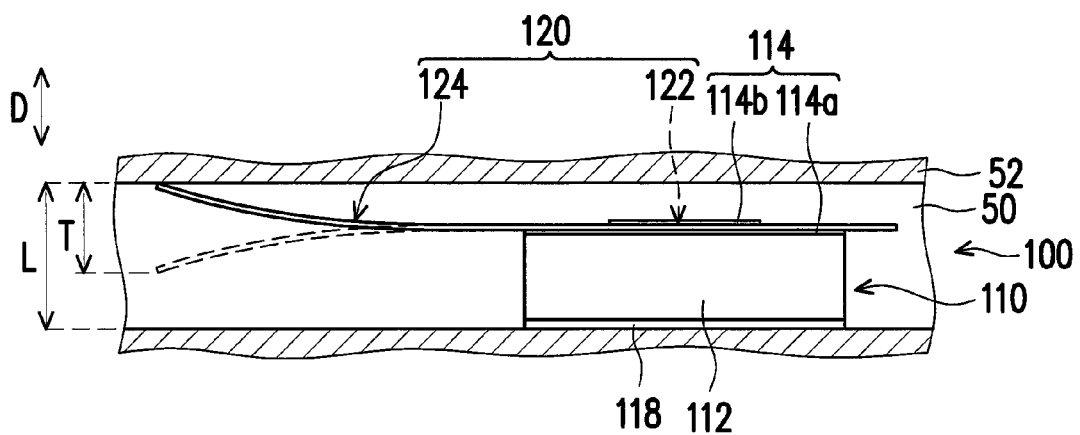
FIG. 3 is a schematic diagram of the heat dissipation device of FIG. 2 in operation.

FIG. 1 is a three-dimensional view of a part of components of a heat dissipation device according to an embodiment of the invention. FIG. 2 is a schematic diagram of applying the heat dissipation device of FIG. 1 to an electronic device. FIG. 3 is a schematic diagram of the heat dissipation device of FIG. 2 in operation. Referring to FIG. 1 to FIG. 3, the heat dissipation device 100 of the present embodiment is adapted to an electronic device 50, and the electronic device 50 is, for example, a notebook (NB), a tablet PC, a smart phone or other types or portable electronic device, and the heat dissipation device 100 is disposed in a casing 52 of the electronic device 50. The heat dissipation device 100 includes a driving module 110 and a heat dissipation sheet 120, where the heat dissipation sheet 120 has a connection portion 122 and a swing portion 124 and is connected to the driving module 110 through the connection portion 122. A thickness of the swing portion 124 along a direction D is smaller than thickness of the swing portion 124 along other directions, and when the driving module 110 receives an input voltage to drive the connection portion 122, the connection portion 122 drive the swing portion 124 to swing back and forth along the direction D to generate a heat dissipation airflow as that shown in FIG. 3. The input voltage is, for example, an alternating current (AC) voltage.

Based on the above configuration, the heat dissipation device 100 generates the heat dissipation airflow by swinging the swing portion 124 of the heat dissipation sheet 120 thereof rather than rotating fan blades to generate the heat dissipation airflow as that does of a conventional cooling fan. Compared to the fan blades of the conventional cooling fan, the heat dissipation sheet 120 has a thinner thickness, which avails a thinning design of the electronic device 50. Moreover, Compared to the fan blades of the conventional cooling fan, a weight of the heat dissipation sheet 120 is lighter, and it consumes less power when the driving module 110 drives the heat dissipation sheet 120, such that power durability of the electronic device 50 is enhanced.

Figure 4:
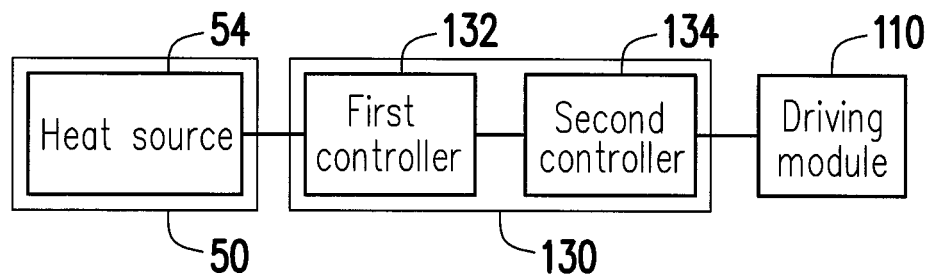
FIG. 4 is a block diagram of a part of components of the electronic device and the heat dissipation device of FIG. 2.

FIG. 4 is a block diagram of a part of components of the electronic device and the heat dissipation device of FIG. 2. Referring to FIG. 4, the electronic device of the present embodiment has a heat source 54, and the heat dissipation device 100 (shown in FIG. 1 to FIG. 3) further includes a control unit 130. The control unit 130 is electrically connected to the driving module 110, and is adapted to determine a heat dissipation requirement of the electronic device 50 according to a temperature of the heat source 54, and accordingly controls a frequency and amplitude of the input voltage.

Figure 5:
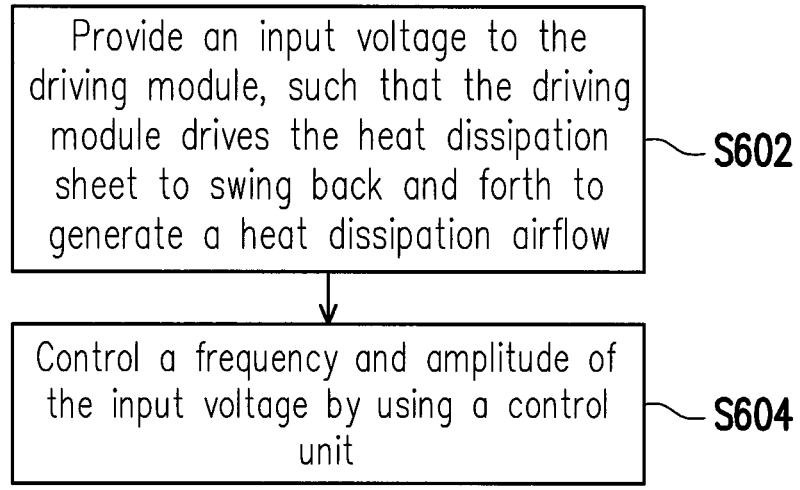
FIG. 5 is a flowchart illustrating a control method of the heat dissipation device of FIG. 1.

A control method of a heat dissipation device of the invention is described below with reference of the heat dissipation device 100 of FIG. 1-FIG. 4. FIG. 5 is a flowchart illustrating a control method of the heat dissipation device of FIG. 1. Referring to FIG. 5, first, an input voltage is provided to the driving module 110, and the driving module 110 drives the heat dissipation sheet 120 to swing back and forth to generate a heat dissipation airflow (step S602). Then, the control unit 130 controls a frequency and amplitude of the input voltage (step S604).

In detail, the higher the frequency of the input voltage is, the higher swing frequency of the swing portion 124 shown in FIG. 1 to FIG. 3 is; the closer the frequency of the input voltage approaches to a natural frequency of the swing portion 124, the more significant resonance effect the swing portion 124 has and the greater the swing range of the swing portion 124 is; the greater the amplitude of the input voltage is, the greater the swing range of the swing portion 124 is; the higher the swing frequency of the swing portion 124 is, the faster the wind speed of the heat dissipation airflow produced by the swing portion 124 is; and the greater the swing range of the swing portion 124 is, the faster the wind speed of the heat dissipation airflow produced by the swing portion 124 is. In this way, the control unit 130 can adjust the swing frequency and swing range of the swing portion 124 by controlling the frequency of the input voltage, and can adjust the swing range of the swing portion 124 by controlling the amplitude of the input voltage, so as to change the wind speed of the heat dissipation airflow generated by the swing portion 124 according to the heat dissipation requirement of the electronic device 50.

For example, when the temperature of the heat source 54 is lower than a first temperature, the control unit 130 determines that the electronic device 50 is in a light use state and has smaller temperature increase and it is unnecessary to activate the heat dissipation function of the heat dissipation device 100, and now the control unit 130 turns off the input voltage, such that the heat dissipation device 100 is in a mute mode without being driven. An actual value of the first temperature can be determined according to the heat dissipation requirement of the electronic device 50, which is not limited by the invention.

Figure 6:
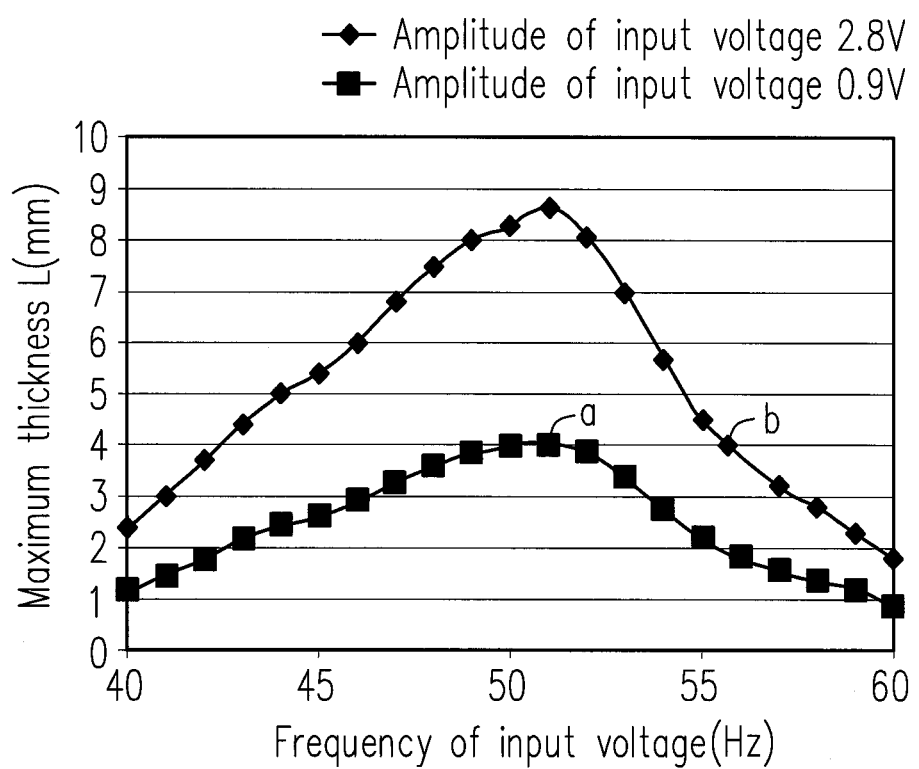
FIG. 6 is a diagram illustrating a relationship between an input voltage and a maximum thickness of the heat dissipation device of FIG. 3 in operation.

FIG. 6 is a diagram illustrating a relationship between the input voltage and a maximum thickness of the heat dissipation device of FIG. 3 in operation. When the temperature of the heat source 54 is higher than the first temperature and is lower than a second temperature, the control unit 130 determines that the electronic device 50 is in a moderate use state and has a larger temperature increase, and it is required to suitably perform the heat dissipation through the heat dissipation device 100, and now the control unit 130 controls the input voltage to be a state a shown in FIG. 6 to have a first frequency (for example, 51 Hz) and a first amplitude (for example, 0.9V), and the swing range of the swing portion 124 is equal to a threshold T shown in FIG. 3, such that a maximum thickness L (4 mm shown in FIG. 6) of the heat dissipation device 100 along the direction D during the operation does not exceed a height of a containing space in the casing 52 of the electronic device 50. Actual values of the threshold value T and the maximum thickness L are determined according to a design method of the electronic device 50 and the heat dissipation device 100, and are not limited by the invention. The first frequency is, for example, equal to the natural frequency (for example, 51 Hz) of the swing portion 124, such that the swing range of the swing portion 124 may reach the threshold T in case of a smaller amplitude (i.e. the aforementioned first amplitude) of the input voltage, and the heat dissipation device 100 can be in a power saving mode of a low power consumption state. In the present embodiment, the heat dissipation sheet 120 is, for example, a flexible sheet made of a plastic or metal material, such that when the heat dissipation sheet 120 is driven by the input voltage having the first frequency (i.e. the natural frequency of the swing portion 124) to swing back and forth, the heat dissipation sheet 120 may have an obvious resonance effect due to flexibility thereof.

When the temperature of the heat source 54 is higher than the second temperature, the control unit 130 determines the electronic device 50 is in a heavy use state and has a larger temperature increase, and the heat dissipation device 100 has to be used to provide better heat dissipation effect, and now the control unit 130 controls the input voltage to be a state b shown in FIG. 6 to have a second frequency (for example, 56 Hz) greater than the first frequency (i.e. the natural frequency of the swing portion 124), so as to increase the swing frequency of the swing portion 124. Moreover, the control unit 130 controls the input voltage to have a second amplitude (for example, 2.8V) greater than the first amplitude, so as to compensate a reduction of the swing range of the swing portion 124 due to that the frequency thereof (the second frequency) is deviated from the natural frequency of the swing portion 124, and accordingly maintain the swing range of the swing portion 124 to be equal to the threshold T. Now, the heat dissipation device 100 is in a high performance mode. Compared to the aforementioned power saving mode (corresponding to the state a shown in FIG. 6), when the heat dissipation device 100 is in the high performance mode (corresponding to the state b shown in FIG. 6), the swing portion 124 has higher swing frequency and has the same swing range (i.e. the threshold T), so that the wind speed of the heat dissipation airflow generated by the swing portion 124 is effectively increased to improve the heat dissipation efficiency. An actual value of the second temperature can be determined by the heat dissipation requirement of the electronic device 50, which is not limited by the invention.

The heat source 54 is, for example, a heat emitting element such as a central processing unit (CPU), a video graphics array (VGA) of the electronic device 50 or a partial casing of the electronic device 50, such as a palm-rest region of the notebook, which is not limited by the invention, and can be determined by the heat dissipation requirement of the electronic device 50. Moreover, besides the first temperature and the second temperature and the corresponding mute mode, the power saving mode and the high performance mode, more temperature thresholds and corresponding driving modes can be set according the heat dissipation requirement of the electronic device 50, which is not limited by the invention.

Referring to FIG. 4, in detail, the control unit 130 of the present embodiment includes a first controller 132 and a second controller 134. The first controller 132 is, for example, an embedded controller (EC) or a keyboard controller (KBC), and is adapted to generate a decision signal according to the temperature (which is lower than the first temperature, higher than the first temperature and lower than the second temperature or higher than the second temperature) of the heat source 54. The second controller 134 is, for example, a micro controller unit (MCU) configured on a motherboard of the electronic device 50 and is electrically connected to the first controller 132 and the driving module 110. The input voltage is, for example, provided to the driving module 110 from the motherboard of the electronic device 50 through the second controller 134, and the second controller 134 is adapted to control the frequency and amplitude of the input voltage according to the aforementioned decision signal, so as to switch the heat dissipation device 100 to the mute mode, the power saving mode or the high performance mode. In the present embodiment, a temperature sensing element is, for example, configured on the heat source 54, and the first controller 132 is electrically connected to the temperature sensing element for obtaining the temperature of the heat source 54 through the temperature sensing element. In other embodiments, the control unit 130 can be other suitable patterns, for example, a single controller integrating the aforementioned function of the first controller 132 and the aforementioned function of the second controller 134, which is not limited by the invention.

Figure 7:
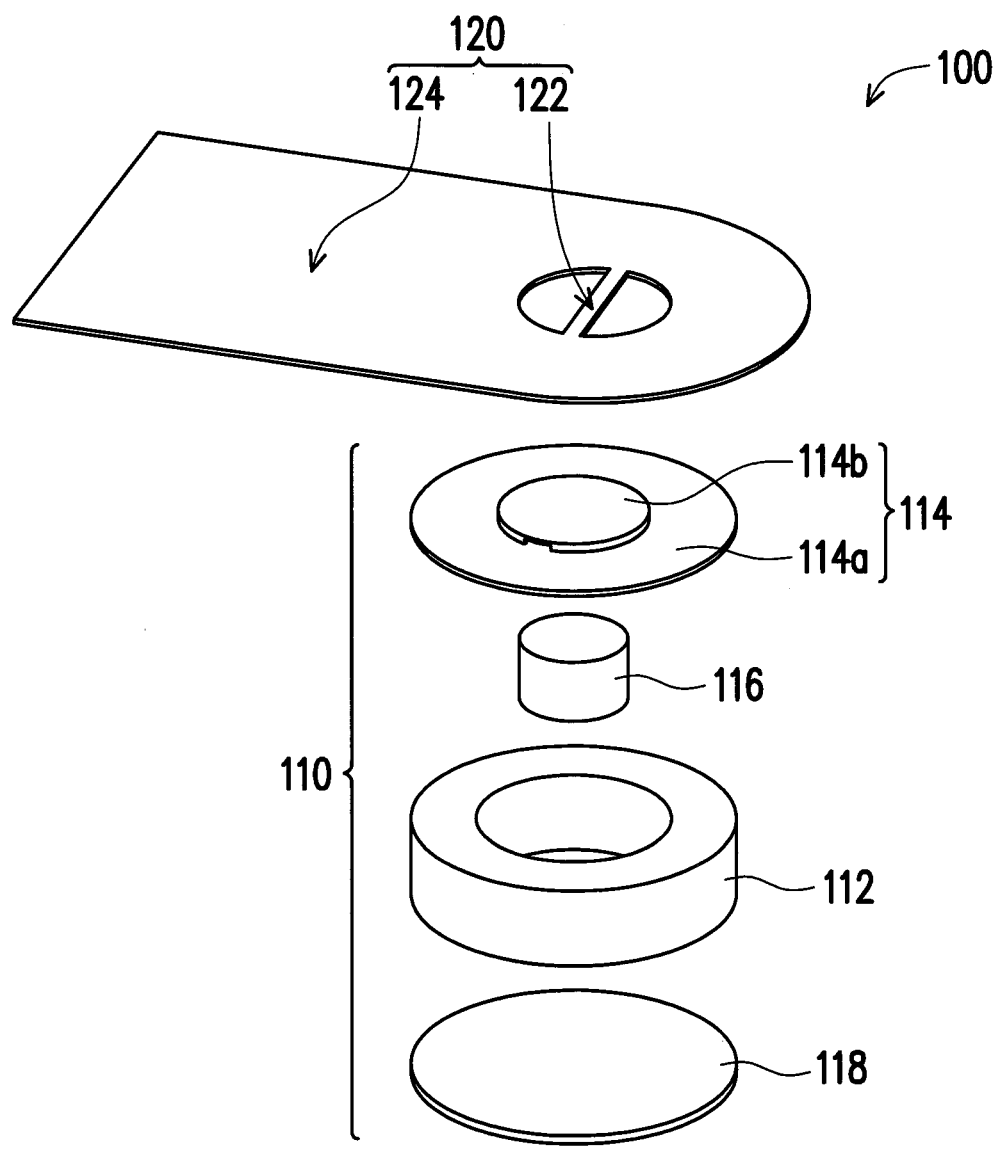
FIG. 7 is an exploded view of the heat dissipation device of FIG. 1.

A detailed structure of the heat dissipation device 100 of the embodiment is described below with reference of a figure. FIG. 7 is an exploded view of the heat dissipation device of FIG. 1. Referring to FIG. 1, FIG. 2 and FIG. 7, the driving module 110 of the present embodiment includes a coil unit 112, a vibration element 114, a magnetic element 116 and a fixing sheet 118. The fixing sheet 118 is fixed in the electronic device 50, and the coil unit 112 has a coil and is fixed to the fixing sheet 118 through, for example, adhesion. The vibration element 114 has an elastic portion 114a and a vibration portion 114b, where the elastic portion 114a is connected between the coil unit 112 and the vibration portion 114b, and the elastic portion 114a and the coil unit 112 are, for example, connected through adhesion. The connection portion 122 of the heat dissipation sheet 120 is, for example, fixed to the vibration portion 114b through a latch, a tenon, adhesion, or other assembling methods. The magnetic element 116 is, for example, a permanent magnet, and is fixed to the vibration portion 124 through adhesion and is aligned to the coil unit 112. When the coil unit 112 continuously receives the input voltage to produce a magnetic field with varied direction to affect the magnetic element 116, the magnetic element 116 drives the vibration portion 114b to vibrate through elastic deformation of the elastic portion 114a, such that the vibration portion 114b drives the connection portion 122 of the heat dissipation sheet 120, so as to drive the swing portion 124 of the heat dissipation sheet 120 to swing back and forth.

Figure 8:
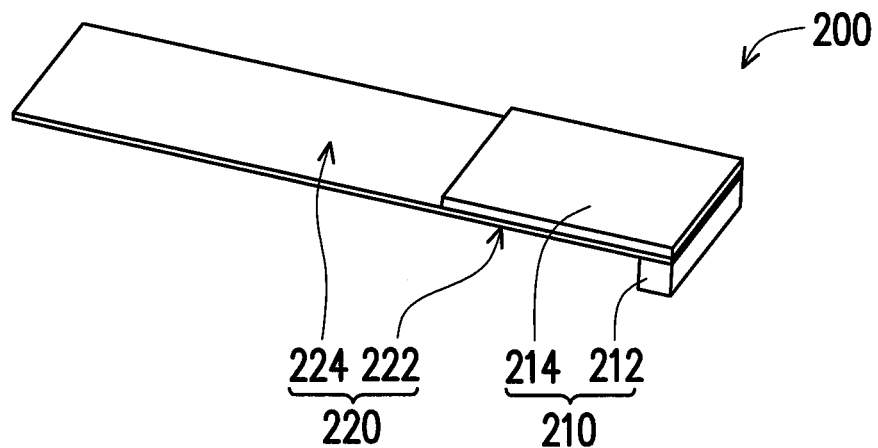
FIG. 8 is a three-dimensional view of a part of components of a heat dissipation device according to another embodiment of the invention.
Figure 9:
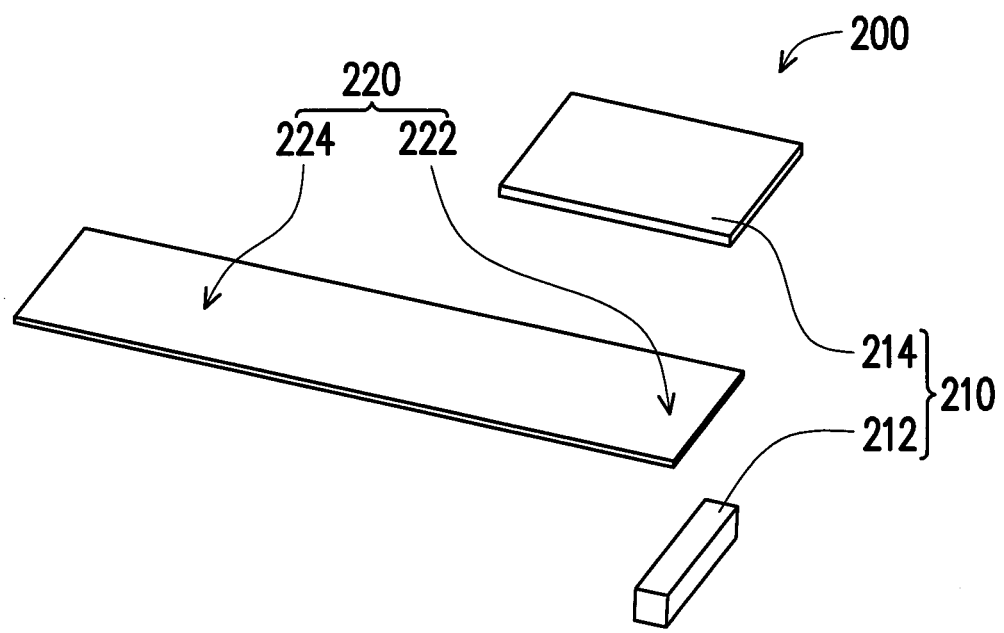
FIG. 9 is an exploded view of the heat dissipation device of FIG. 8.

The pattern of the heat dissipation device is not limited by the invention, and another embodiment is provided below for descriptions. FIG. 8 is a three-dimensional view of a part of components of a heat dissipation device according to another embodiment of the invention. FIG. 9 is an exploded view of the heat dissipation device of FIG. 8. Referring to FIG. 8 and FIG. 9, in the heat dissipation device 200 of the present embodiment, the driving module 210 includes a base 212 and a piezoelectric piece 214. The connection portion 222 of the heat dissipation sheet 220 is, for example, fixed to the base 212 through adhesion, and the piezoelectric piece 214 is, for example, fixed to the connection portion 222 of the heat dissipation sheet 220 through adhesion. When the piezoelectric piece 214 continuously receives the input voltage, the piezoelectric piece 214 is continuously deformed to drive the connection portion 222 of the heat dissipation sheet 220, so as to drive the swing portion 224 of the heat dissipation sheet 220 to swing back and forth.

In summary, the heat dissipation device of the invention generates the heat dissipation airflow by swinging the heat dissipation sheet thereof rather than rotating fan blades to generate the heat dissipation airflow as that does of a conventional cooling fan. Compared to the fan blades of the conventional cooling fan, the heat dissipation sheet of the invention has a thinner thickness, which avails a thinning design of the electronic device. Moreover, Compared to the fan blades of the conventional cooling fan, a weight of the heat dissipation sheet is lighter, and it consumes less power when the driving module drives the heat dissipation sheet, such that power durability of the electronic device is enhanced. Moreover, by controlling the frequency and amplitude of the input voltage, the heat dissipation device can be switched to the mute mode, the power saving mode or the high performance mode, so as to improve universality of the heat dissipation device. In addition, the heat dissipation sheet can be a flexible sheet, and in case that the frequency of the input voltage is equal to the resonance frequency of the heat dissipation sheet (i.e. the aforementioned power saving mode), the heat dissipation sheet may have an obvious resonance effect due to flexibility thereof, such that the input voltage with a smaller amplitude can drive the heat dissipation sheet to produce a larger swing range, so as to achieve the power saving effect.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A heat dissipation device, comprising:
a driving module;
a heat dissipation sheet, having a connection portion and a swing portion, and connected to the driving module through the connection portion, wherein when the driving module receives an input voltage to drive the connection portion, the connection portion drives the swing portion to swing back and forth to generate a heat dissipation airflow; and
a control unit, wherein the control unit is electrically connected to the driving module and controls a frequency and amplitude of the input voltage,
wherein the heat dissipation device is adapted to an electronic device, the electronic device has a heat source, and the control unit is adapted to control the frequency and the amplitude of the input voltage according to a temperature of the heat source, and
wherein when the temperature of the heat source is lower than a first temperature, the control unit turns off the input voltage, when the temperature of the heat source is higher than the first temperature and is lower than a second temperature, the control unit controls the input voltage to have a first frequency and a first amplitude, and when the temperature of the heat source is higher than the second temperature, the control unit controls the input voltage to have a second frequency and a second amplitude, wherein the first frequency is equal to a natural frequency of the swing portion, the second frequency is greater than the natural frequency of the swing portion, and the second amplitude is greater than the first amplitude.

2. The heat dissipation device as claimed in claim 1, wherein the control unit controls the frequency of the input voltage to adjust a swing frequency and a swing range of the swing portion, and controls the amplitude of the input voltage to adjust the swing range of the swing portion.

3. The heat dissipation device as claimed in claim 1, wherein when the input voltage has the first frequency and the first amplitude, the swing range of the swing portion is equal to a threshold, and when the input voltage has the second frequency and the second amplitude, the swing range of the swing portion is equal to the threshold.

4. The heat dissipation device as claimed in claim 1, wherein the control unit comprises:
   a first controller, adapted to generate a decision signal according to the temperature of the heat source; and
   a second controller, electrically connected to the first controller and the driving module, wherein the input voltage is adapted to be provided to the driving module through the second controller, and the second controller is adapted to control the frequency and the amplitude of the input voltage according to the decision signal.

5. The heat dissipation device as claimed in claim 1, wherein the driving module comprises:
   a coil unit;
   a vibration element, having an elastic portion and a vibration portion, wherein the elastic portion is connected between the coil unit and the vibration portion, and the connection portion of the heat dissipation sheet is fixed to the vibration portion; and
   a magnetic element, fixed to the vibration portion, and aligned to the coil unit, wherein when the coil unit receives the input voltage to produce a magnetic field to affect the magnetic element, the vibration portion vibrates due to elastic deformation of the elastic portion to drive the connection portion of the heat dissipation sheet.

6. The heat dissipation device as claimed in claim 1, wherein the heat dissipation sheet is a flexible sheet.

7. The heat dissipation device as claimed in claim 1, wherein a thickness of the swing portion along a direction is smaller than thickness of the swing portion along other directions, and the connection portion is adapted to drive the swing portion to swing back and forth along the direction to generate the heat dissipation airflow.

8. A control method of heat dissipation device, adapted to a heat dissipation device, wherein the heat dissipation device comprises a driving module and a heat dissipation sheet, the control method comprising:
   providing an input voltage to the driving module, such that the driving module drives the heat dissipation sheet to swing back and forth to generate a heat dissipation airflow; and
   controlling a frequency and amplitude of the input voltage by a control unit, wherein the heat dissipation device is adapted to an electronic device, the electronic device has a heat source, and the step of controlling the frequency and the amplitude of the input voltage comprises:
   controlling the frequency and the amplitude of the input voltage according to a temperature of the heat source, wherein the step of controlling the frequency and the amplitude of the input voltage according to the temperature of the heat source comprises:
      turning off the input voltage by the control unit when the temperature of the heat source is lower than a first temperature;
      controlling the input voltage to have a first frequency and a first amplitude by the control unit when the temperature of the heat source is higher than the first temperature and is lower than a second temperature, wherein the first frequency is equal to a natural frequency of the swing portion; and
      controlling the input voltage to have a second frequency and a second amplitude by the control unit when the temperature of the heat source is higher than the second temperature, wherein the second frequency is greater than the natural frequency of the swing portion, and the second amplitude is greater than the first amplitude.

9. The control method as claimed in claim 8, wherein the step of controlling the frequency and the amplitude of the input voltage comprises:
   controlling the frequency of the input voltage to adjust a swing frequency and a swing range of the heat dissipation sheet; and
   controlling the amplitude of the input voltage to adjust the swing range of the heat dissipation sheet.

10. The control method as claimed in claim 8, wherein the step of controlling the input voltage to have the first frequency and the first amplitude comprises controlling the swing range of the swing portion to be equal to a threshold, and the step of controlling the input voltage to have the second frequency and the second amplitude comprises controlling the swing range of the swing portion to be equal to the threshold.

11. The control method as claimed in claim 8, wherein the control unit comprises a first controller and a second controller, and the step of controlling the frequency and the amplitude of the input voltage comprises:
   generating a decision signal by the first controller according to the temperature of the heat source; and
   controlling the frequency and the amplitude of the input voltage by the second controller according to the decision signal.

12. The control method as claimed in claim 8, wherein a thickness of the heat dissipation sheet along a direction is smaller than thickness of the heat dissipation sheet along other directions, and the step of driving the heat dissipation sheet to swing back and forth comprises:
   driving the heat dissipation sheet to swing back and forth along the direction.

13. The heat dissipation device as claimed in claim 1, wherein the driving module comprises:
   a piezoelectric piece, fixed to the connection portion, wherein when the piezoelectric piece receives the input voltage, the piezoelectric piece is deformed to drive the connection portion.

* * * * *